(12) United States Patent
Lee et al.

(10) Patent No.: US 11,015,581 B2
(45) Date of Patent: May 25, 2021

(54) COATING MONITORING SYSTEM OF WIND TURBINES AND OPERATING METHOD THEREOF

(71) Applicant: SHIP AND OCEAN INDUSTRIES R & D CENTER, New Taipei (TW)

(72) Inventors: Yueh-Lien Lee, New Taipei (TW); Jau-Horng Chen, New Taipei (TW); Cheng-Hsien Chung, New Taipei (TW); Hua-Tung Wu, New Taipei (TW); Shu-Wen Hsu, New Taipei (TW)

(73) Assignee: SHIP AND OCEAN INDUSTRIES R&D CENTER, New Taipei (TW)

( * ) Notice: Subject to any disclaimer, the term of this patent is extended or adjusted under 35 U.S.C. 154(b) by 219 days.

(21) Appl. No.: 16/232,032

(22) Filed: Dec. 25, 2018

(65) Prior Publication Data
US 2020/0191121 A1     Jun. 18, 2020

(30) Foreign Application Priority Data

Dec. 14, 2018 (TW) ................................ 107145357

(51) Int. Cl.
*F03D 17/00* (2016.01)
*B81B 7/00* (2006.01)
*G01N 27/02* (2006.01)
*G01R 27/16* (2006.01)

(52) U.S. Cl.
CPC .............. *F03D 17/00* (2016.05); *B81B 7/008* (2013.01); *G01N 27/028* (2013.01); *G01R 27/16* (2013.01); *B81B 2201/0292* (2013.01); *F05B 2260/80* (2013.01); *F05B 2260/95* (2013.01); *F05B 2280/6011* (2013.01)

(58) Field of Classification Search
CPC . F03D 17/00; B81B 7/008; B81B 2201/0292; G01N 27/028; G01N 27/02; G01N 17/02; G01N 17/04; G01N 27/416; G01R 27/16; F05B 2260/80; F05B 2260/95; F05B 2280/6011; F05B 2260/83; B81L 37/008
USPC ........................................................ 324/600
See application file for complete search history.

(56) References Cited

U.S. PATENT DOCUMENTS

| 7,582,359 | B2 * | 9/2009 | Sabol ...................... F01D 17/02 428/469 |
| 2010/0025238 | A1 * | 2/2010 | Gottlieb ............. A61B 5/14532 204/401 |

* cited by examiner

*Primary Examiner* — Farhana A Hoque
(74) *Attorney, Agent, or Firm* — Cheng-Ju Chiang

(57) ABSTRACT

The present invention discloses a coating monitoring system of wind turbines, comprising a monitoring object having at least one coating on the surface. A coating monitoring module is coupled to the monitoring object, and the coating monitoring module comprises a MEMS system including a signal generating device, and a printed circuit board connected to the MEMS system. The coating monitoring module measures a measured coating impedance value of the monitoring object. A potentiostat, calculating an actual coating impedance value of the monitoring object, is connected to the monitoring object. And a computing device coupled to the coating monitoring module, the computing device correcting the measured coating impedance value based on the actual coating impedance value.

9 Claims, 8 Drawing Sheets

COATING MONITORING SYSTEM OF WIND TURBINES AND OPERATING METHOD THEREOF

TECHNICAL FIELD

The present invention relates to a coating monitoring system of wind turbines and operating method thereof, particularly, to a coating monitoring system of wind turbines which is applied to various offshore wind power generation equipment, and the operating method thereof.

BACKGROUND OF RELATED ARTS

In order to know the corrosion of objects (buried pipes, offshore working platforms, wind turbines, bridge steel structures or hulls) in corrosive environment, human eyes should be used to observe it. However, if the submarine objects (such as the steel structure of offshore platform) are located on the seabed, it is necessary to send divers to the seabed for exploring work. The risk to divers is high and the cost is high. Metal corrosion monitoring is often used in environments prone to corrosion (e.g. in the sea or under the ground) to monitor the corrosion status of various objects in order to replace them immediately before they are seriously damaged.

At present, however, most of the corrosion measurement techniques are only applicable to laboratory scale, which the main reason is that there are many and complicated equipment to be used in these corrosion measurement techniques. For example, in measurements of common electrochemical impedance, in addition to the samples to be measured, a considerable volume of power supply, reference electrodes, auxiliary electrodes and beakers are required to be erected together for performing the measurements.

Therefore, in order to apply these corrosion measurement techniques to offshore wind turbines, how to overcome the needs of many measuring instruments is a difficult problem. Additionally, these corrosion measurement techniques are currently dependent on manpower on-site implementation. However, most offshore wind turbines belong to unmanned structures, and offshore wind farms are far away from route, so inspectors and maintenance personnel can not frequently go to the site. Therefore, how to endow corrosion monitoring with the functions of remote control and remote transmission is an important issue.

SUMMARY

To resolve the drawbacks of the prior arts, the purpose of the present invention is to propose a coating monitoring system of wind turbines to simplify the structure of system, to complete an immediate monitoring system for structural corrosion of various offshore wind power generation equipment, so as to facilitate maintenance personnel to pay early attention to the condition of the wind turbines, and to carry out immediate maintenance and reinforcement. On the other hand, in order to protect the monitoring system itself, while ensuring the reliability of the data, the corrosion of the monitoring system itself is also considered by the invention.

The present invention discloses a coating monitoring system of a wind turbine, comprising: a monitoring object, which has at least one coating on its surface; a coating monitoring module connected with the monitoring object, wherein the coating monitoring module includes a microelectromechanical system (MEMS) including a signal generating device, and a printed circuit board connected to the MEMS system, wherein the coating monitoring module measures an impedance value of the coating; a potentiostat coupled to the monitoring object and the coating monitoring module, to measure an actual impedance value of the coating of the monitoring object; and a computing device coupled to the coating monitoring module, wherein the computing device corrects the measured impedance value of the coating based on the actual impedance value of the coating.

According to another aspect of the invention, an operation method of a coating monitoring system of a wind turbine is proposed, comprising the steps of: (A) outputting a signal voltage by a signal generation device; (B) measuring an impedance value of a surface coating of a monitored object by a coating monitoring module; (C) measuring an actual impedance value of the surface coating of the monitoring object by a potentiostat; and (D) correcting the measured impedance value of the surface coating according to the actual impedance value of the surface coating by a computing device.

In step (B), in measuring process of the coating monitoring module, the monitoring object is connected in series with a known resistance to compute an impedance value of the surface coating of the monitoring object by a voltage dividing formula.

In step (B), in measuring process of the coating monitoring module, the monitoring object is adhered to a container, then a corrosion solution of sodium chloride is filled into the container, and placing a reference electrode in the solution to complete a closed circuit system to measure an actual impedance value of the surface coating of the monitoring object.

Embodiments of the invention are illustrated by way of example, and not by way of limitation, in the figures of the accompanying drawings in which like reference numerals refer to similar elements:

DETAILED DESCRIPTION OF THE INVENTION

In order to understand the technical features and practical efficacy of the present invention and to implement it in accordance with the contents of the specification, hereinafter, preferred embodiments of the present invention will be described in detail with reference to the accompanying drawings.

The invention proposes a coating monitoring system for offshore wind turbines and its operation method. The size of the system is greatly reduced so that the monitoring system can be directly installed on the structure of offshore wind turbine. At the same time, the measurement accuracy of corrosion degree of the wind turbine is maintained, and the function of wireless transmission is provided. The measured data can be sent to the remote inspector in advance maintaining for serious corrosion of wind turbine to reduce the risk of structural damage.

Figure 1:
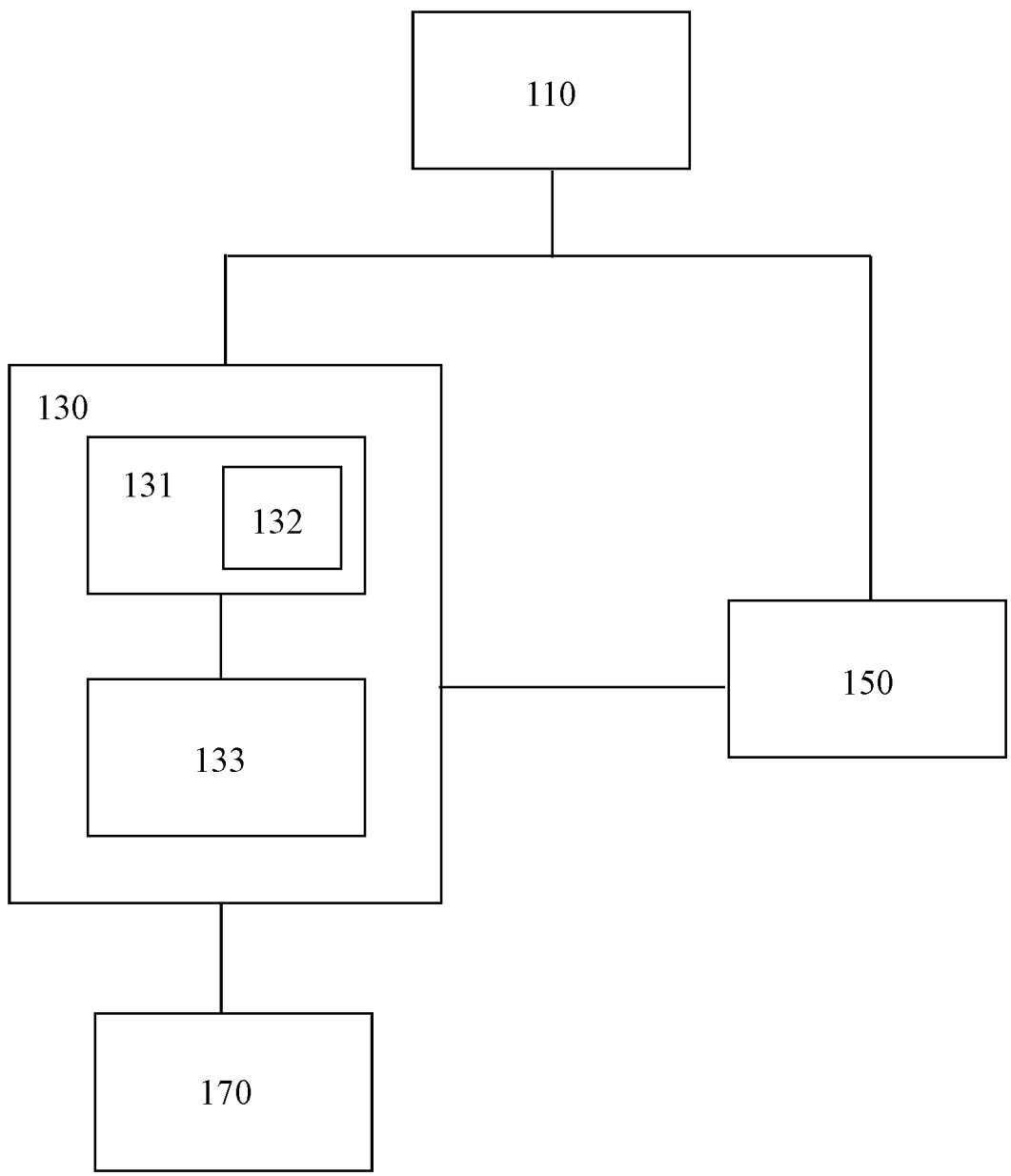
FIG. 1 is a schematic diagram of a coating monitoring system of a wind turbine in a preferred embodiment of the present invention.

Firstly, please refer to FIG. 1, it illustrates a schematic diagram of a coating monitoring system of a wind turbine in a preferred embodiment of the present invention. As shown in FIG. 1, the coating monitoring system 100 of the wind turbine of the present embodiment includes: a monitoring object 110, which has at least one coating on its surface; a coating monitoring module 130, which is connected with the monitoring object 110, and the coating monitoring module 130 includes a micro-electromechanical system (MEMS) 131 with a signal generation device 132 and a printed circuit board 133 connected with the MEMS 131; a potentiostat 150, which is connected with the monitoring object 110 and the coating monitoring module 130; and a computing device 170 connected with the coating monitoring module 130. Through the measurements and calculations of the above components, the impedance value of the coating of offshore wind turbine can be obtained immediately, and the corrosion degree of the wind turbine can be analyzed, so that the maintenance personnel can pay attention to the state of the wind turbine in advance and repair and strengthen it in time.

Figure 2:
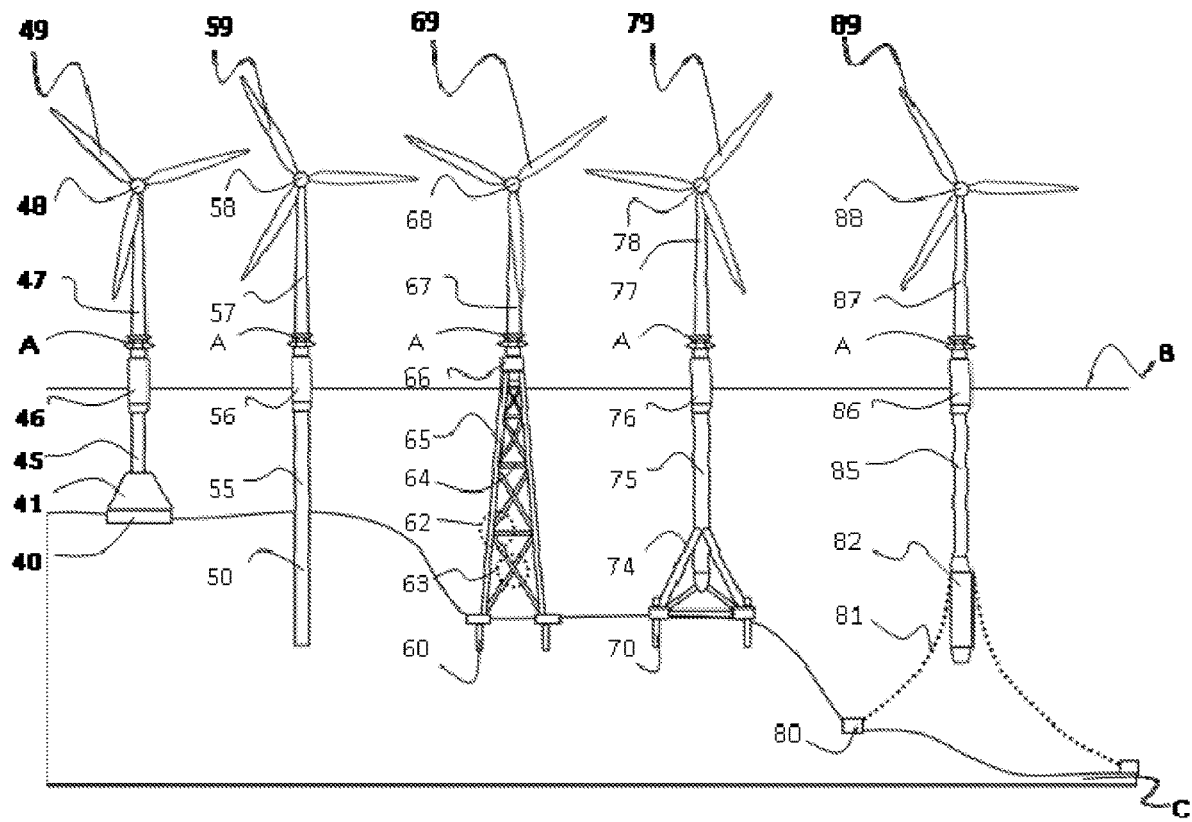
FIG. 2 is a schematic diagram of the offshore wind power generation equipment in accordance with one embodiment of the present invention.

In this embodiment, the object 110 to be measured may be various offshore wind power generation equipment or parts taken off from the offshore wind power generation equipment. Please refer to FIG. 2, offshore wind power generation equipment has on-water parts above sea level B and under-water parts below sea level B. Generally, the on-water parts include at least wind turbine blades (49, 59, 69, 79, 89), wind turbine cabin (48, 58, 68, 78, 88), tower (47, 57, 67, 77, 87) and tower platform A.

The under-water parts have various configurations according to the difference of foundation or support structure. For a gravity foundation structure of common configuration has a triangular base 40, a scouring protection device 41, an on-water tower 47 and an under-water post (column) 45 connected to a connection portion (duct) 46. For a monopile structure, the on-water tower 57 is connected with an under-water pile 55 through a connection portion 56, in which a portion 50 of the pile represents a part structure installed in seabed C. For a Jacket structure, it is usually connecting the support structure (e.g., composed of the pillar 65, the diagonal pillar 64, the X joint 63 and the K joint 62) with the pile 60 in the seabed C, and the tower 67 on the water is mainly connected with the underwater support structure through the connection portion 66.

Specifically, there are diagonal pillars 64 configured between the pillars 65 of the support structure, and the K joint 62 is formed at the connection of the diagonal pillars 64 and the pillars 65 due to set of the diagonal pillars 64, and the X joint 63 is formed between the diagonal pillars 64 and adjacent diagonal pillars 64. For a tripod structure, as it has three foundation piles 70, and the diagonal pillars 74 are connected between the foundation piles 70 and the pillars 75. The on-water tower 77 is connected to the underwater pillar 75 through the connection portion 76. The offshore wind turbines in deeper water area can also use floating structure to change the underwater structure configurations, such as utilizing an anchor chain 81 connected with an anchor 80. The length of the anchor chain 81 varies with the practical demand. The anchor chain 81 is connected with a buoyancy device 82 and a support device 85, and the on-water tower 87 is connected with the underwater support device 85 through the connection portion 86.

The main contact areas between offshore wind power generation equipment and corrosive environment are divided into five portions: atmospheric area above sea level B (wind turbine blades, wind turbine cabin and tower), splash area, tidal area, submerged area (underwater portion below sea level B) and sea mud area. The atmospheric area will not be directly exposed to sea water, so the damage degree of chloride ion concentration and corrosion factor is the lowest. As long as anti-corrosion ability of coating is enough, the service life of offshore wind turbine can be effectively increased. The cathodic protection method is usually used to protect the whole submerged area under sea water. The coating protection is mainly applied in the tidal area, and cathodic protection is supplemented for anti-corrosion. While corrosion is the most serious in the "splash zone" where the tide is unable to touch but still beaten by waves, this area must rely on the highest specification of anti-corrosion coatings. Among them, a material of the coating of the monitoring object 110 is a single layer of epoxy resin or polyurethane.

In this embodiment, the coating monitoring module 130 can be installed on offshore wind power generation equipment (i.e., the monitoring object). Specifically, the coating monitoring module 130 can be located in the atmospheric area, splash area, tidal area, sea mud area and full immersion (submerged) area of offshore wind power generation equipment, especially in the "splash area" as the main measurement area of the embodiment. In addition, the coating monitoring module 130 includes a microelectromechanical system (MEMS) 131, which is connected to the monitoring object 110, and a signal generating device 132 which is connected to the MEMS 131.

Specifically, the coating monitoring module 130 can also be called a coating impedance analyzer (CIA) which is mainly composed of the FPGA MEMS 131 and the printed circuit board 133. The FPGA MEMS 131 has the signal generating device to provide the function of signal generation, and is connected to a computing device for power supply and data transmission so that utility rate of external instruments is greatly reduced. In order to shorten the measurement time, the coating monitoring module 130 measures the sample at a single point frequency of 1 Hz to test its measurement performance; and the coating monitoring module 130 can shorten the single measurement time to less than one minute because of the change of measurement principle and the selection of single sampling frequency, which greatly reduces the time cost of measurement.

In addition, because the layer impedance value of the measurement target (monitoring object 110) is set between $10^7$ ohm and $10^9$ ohm, the known reference resistance value is selected as $10^8$ ohm. The working principle of the coating monitoring module 130 is voltage divider rule; that is, the voltage distributed by each load is proportional to its impedance. Therefore, the known resistance $Z_{ref}$ and the monitoring object (coating) 110 are connected in series, and 10 mV alternating current (AC) voltage is applied thereto. The potential difference between an input terminal of the known resistance $Z_{ref}$ and an output terminal of the monitoring object (coating) 110 is measured. Then, an impedance value $Z_c$ of the monitoring object (coating) 110 can be calculated based-on the voltage divider rule. The following will be further explained by the system circuit diagram of the coating monitoring module 130.

Figure 3:
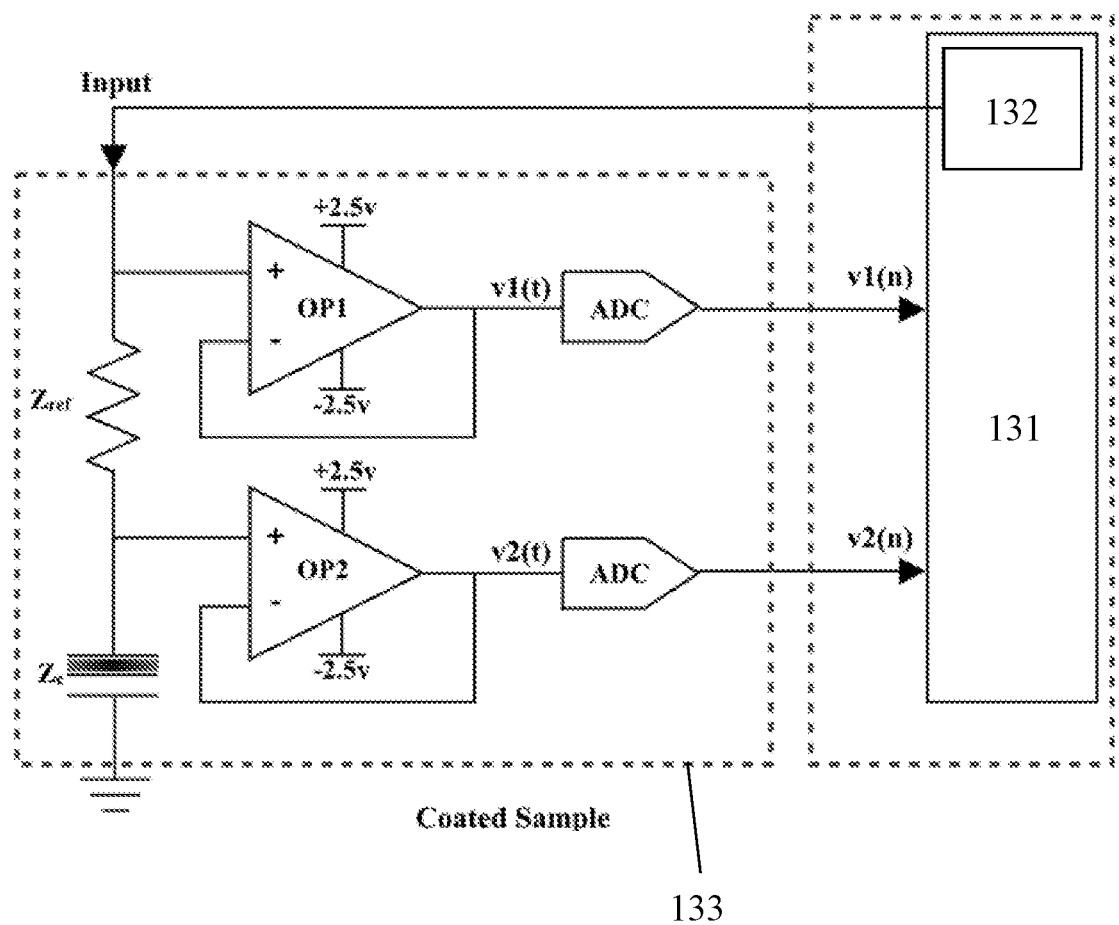
FIG. 3 is a schematic diagram of a coating monitoring module of the preferred embodiment of the present invention.

Furthermore, the coating monitoring module 130 has a system circuit. The system circuit can refer to FIG. 3. The system circuit are mainly divided by two parts of the printed circuit board 133 and the MEMS 131. In the printed circuit board 133, the system circuit is used to connect the monitoring object in series with a known resistance $Z_{ref}$, and an input terminal of the signal voltage V1 and an output terminal of the signal voltage V2 are set at both terminals of the known resistance $Z_{ref}$, respectively. On the other hand, the input terminal of the signal voltage V1 can be connected with the signal generating device of the MEMS 131, and the signal generating device outputs a signal voltage to the printed circuit board 133. After acquiring the signal voltage V1 of the input terminal and the signal voltage V2 of the output terminal, based-on the resistance value of known resistance $Z_{ref}$, the value of impedance $Z_c$ of a measured coating of the monitoring object can be obtained by the transformation of voltage dividing formula $$V_2(1\ Hz) = V_1(1\ Hz)\frac{Zc(1\ Hz)}{Zref + Zc(1\ Hz)}.$$

Finally, the impedance value $Z_c$ of the measured coating is converted to a digital signal by an Analog-to-digital converter (ADC) and outputted to the MEMS 131. Among them, the resistance of the known resistance $Z_{ref}$ is $10^8$ ohms, and the signal generating device outputs 10 mV (millivolts) signal voltage. In addition, the coating monitoring module 130 can also include a remote transmission device (not shown), which is connected to the MEMS 131 and the computing device 170. The remote transmission device can wirelessly transmit the measured impedance values of the coating measured by the coating monitoring module 130 to the outside device.

In addition, in order to achieve the standard accuracy measurement of coating of the monitoring object 110 in the coating monitoring system 100 of wind turbines, the accuracy of standard color code resistance is tested by the coating monitoring module 130, using potentiostat as standard, wherein the standard color code resistance is $10^6$ ohms-1.5× $10^9$ ohms, covering the measurement target $10^7$ ohms-$10^9$ ohms. The monitoring object 110 in the system can also be connected with a potentiostat 150. Specifically, the monitoring object 110 is removed to be measured. The potentiostat 150 is used to measure actual impedance value of the coating of the monitoring object 110 as a standard, and the actual impedance value of the coating of the monitoring object 110 is transmitted to the computing device 170 via the coating monitoring module 130. The computing device 170 compares the measured impedance values of coating transmitted by the coating monitoring module 130 with the actual impedance values of coating transmitted by the potentiostat 150, and corrects the measured impedance values of coating based on the actual impedance values of coating.

The computing device may be an industrial computer, a personal computer, a server or other device with operation function and power supply. The computing device 170 may also include a database to store the historical records of the actual impedance values of coating and the actual impedance values of coating mentioned above, so as to facilitate the maintenance personnel to observe the corrosion changes of the objects to be measured. The establishment of the database can provide a big data of long-term accumulated maritime to professionals or researchers to carry out follow-up statistical analysis.

Figure 4:
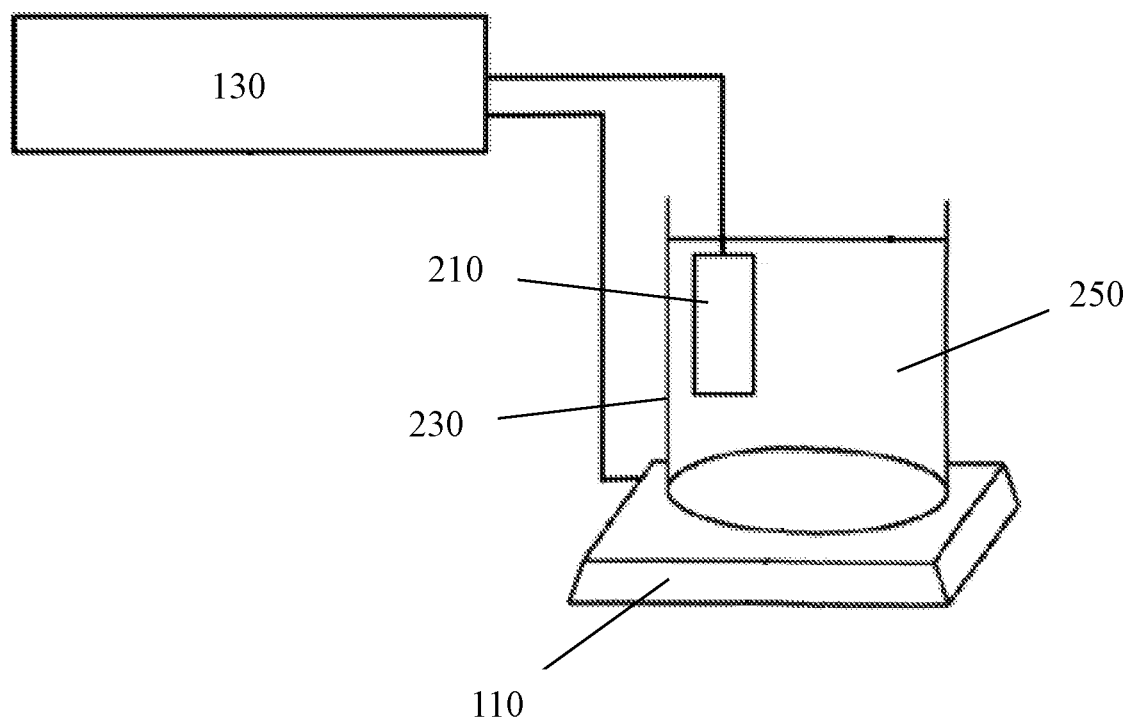
FIG. 4 is a schematic diagram of the measuring process of the potentiostat of the preferred embodiment of the present invention.

Specifically, an accuracy measurement of coating sample of the monitoring object 110 in the coating monitoring system 100 of wind turbines can be referred to FIG. 4. Firstly, the monitoring object 110 (a portion of the monitoring object) is glued to the bottom of a water pipe container 230 (the area to be measured is about 5-10 cm², preferable 7 cm²), then a corrosion solution of sodium chloride 250 with the concentration between 3.0-4.0 weight percentage (wt %) (preferable 3.5 wt %) is filled into the container 230. A reference electrode 210 (graphite carbon rod) is placed in the solution to complete a closed circuit system of accurate measurement, and the environmental temperature of measuring is controlled at 25° C. The coating of the monitoring object 110 with better corrosion resistance can be selected, such as a single layer of epoxy resin with a thickness of 200 or 250 micrometer (m) or a single layer of polyurethane with a thickness of 30-50 μm, and the alternating current (AC) impedance value is larger than $10^8$ ohms. At the beginning of the measurement, AC potential output by the signal generating device is set by a tiny potential (10 mV) to ensure that the coating does not be damaged in measuring process. The measured data under the tiny potential is compared with data measured by the potentiostat, and discusses the measurement accuracy for AC impedance of the coating of the coating monitoring module 130.

In the measurement mode of the monitoring system 100 of this embodiment, the primary measurement object is the measuring impedance value of coating of the monitoring object 110. Then, the actual measuring impedance value (data) of coating measured by the potentiostat 150 is used for bi-directional reference.

For example, Table 1 indicates measurement data of standard resistance, based-on the data (measured impedance value of coating) measured by the coating monitoring module corresponding to the data (actual impedance value of coating) measured by the potentiostat, wherein the measurement result of the coating monitoring module is quite close to that of the potentiostat. Good accuracy is obtained when measuring an order of $10^6$ ohms resistance less than the target lower limit ($10^7$ ohms) and comparatively good accuracy is also obtained when measuring $1.5×10^9$ ohms resistance higher than the target upper limit ($10^9$ ohms).

TABLE 1

Measurement Data of Standard Resistance

| Standard resistance (ohm) | $10^6$ | $10^7$ | $10^8$ | $10^9$ | $1.5 × 10^9$ |
|---|---|---|---|---|---|
| coating monitoring module (ohm) | $1.00 × 10^6$ | $1.01 × 10^7$ | $1.00 × 10^8$ | $9.91 × 10^8$ | $1.52 × 10^9$ |
| potentiostat (ohm) | $9.98 × 10^5$ | $1.00 × 10^7$ | $1.02 × 10^8$ | $1.00 × 10^9$ | $1.49 × 10^9$ |

Figure 5:
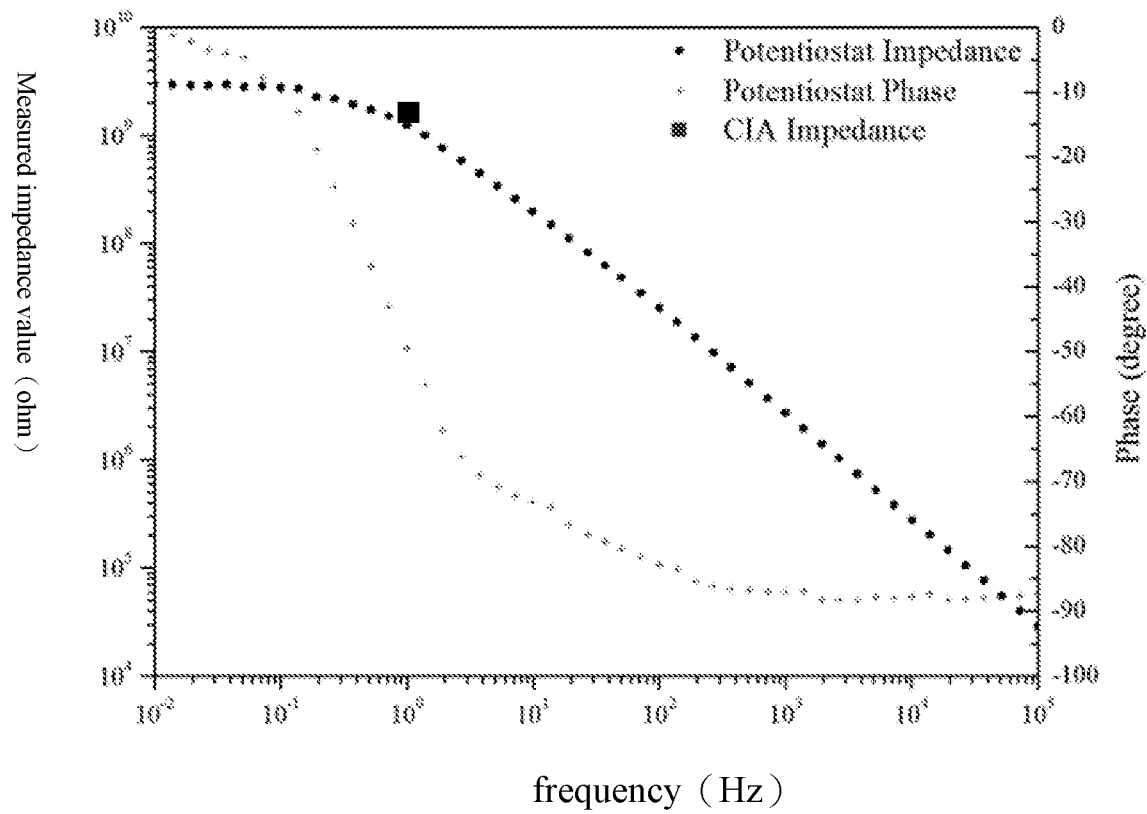
FIG. 5 illustrates comparisons of measurement results for coating of epoxy resin sample (200 µm) of test object of the preferred embodiment of the present invention.
Figure 6:
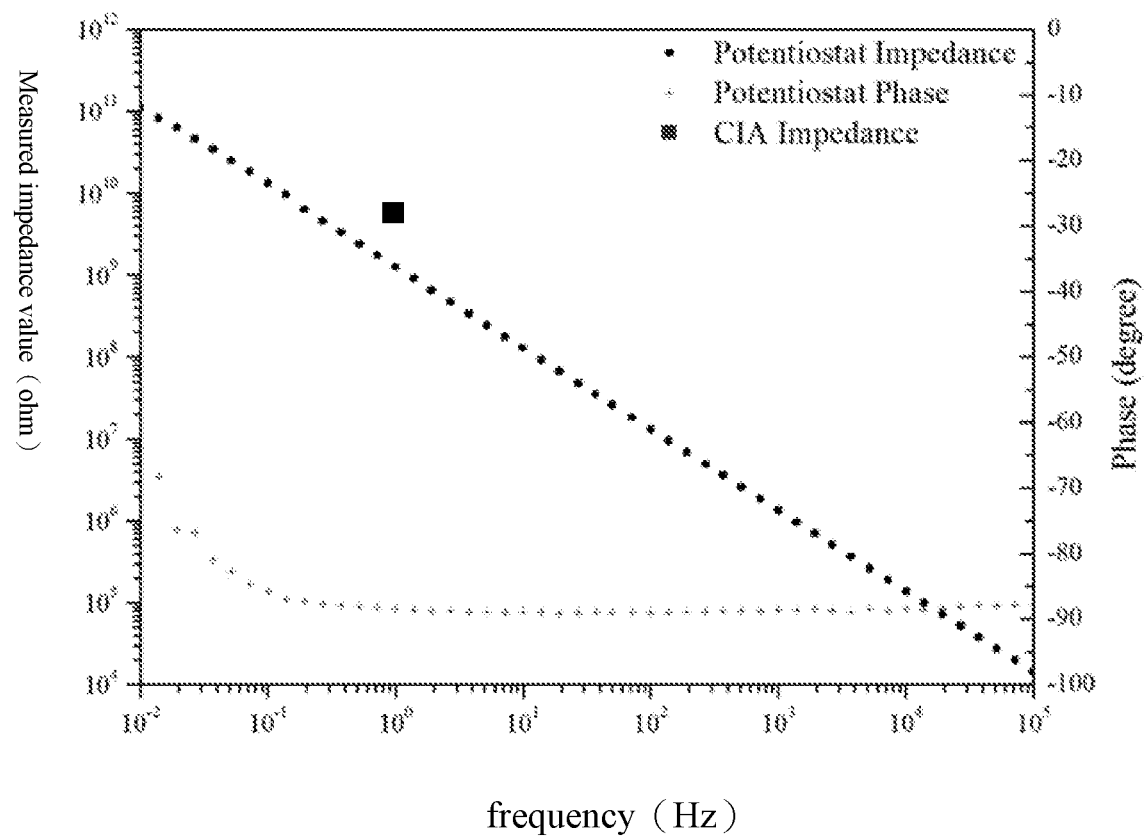
FIG. 6 illustrates comparisons of measurement results for coating of epoxy resin sample (250 µm) of test object of the preferred embodiment of the present invention.

Preliminary experimental results of the accuracy test of standard resistance measurement confirm that the measured impedance value of the coating monitoring module can be reached to $1.5×10^9$ ohms. In order to test the measurement performance of the coating, the coating monitoring module is used to measure the coating sample, and the potentiostat measured data is referred for a bi-directional reference. Please refer to FIG. 5 and FIG. 6, FIG. 5 illustrates comparisons of measurement results for coating of epoxy resin sample (200 μm) of test object and FIG. 6 illustrates comparisons of measurement results for coating of epoxy resin sample (250 μm) of test object. The black dot curve in the figure represents the impedance measurement results of potentiostat, the cross symbol curve represents the phase angle measurement results of potentiostat, and the black square is the measurement results of coating monitoring module.

FIG. 5 shows that the measurement results of coating monitoring module and potentiostat are accurate for high impedance coatings (the measured impedance value of coating measured by coating monitoring module is $1.23 \times 10^9$ ohms and the actual impedance value of coating measured by potentiostat is $1.54 \times 10^9$ ohms); however, FIG. 6 shows that the accuracy of measurement results of another group of high impedance coating are not good (the measured impedance value of coating measured by coating monitoring module is $1.26 \times 10^9$ ohms and the actual impedance value of coating measured by potentiostat is $5.33 \times 10^9$ ohms). In FIG. 5 and FIG. 6, it can be seen that the impedance values of the two coating samples at 1 Hz measured by the potentiostat are almost the same. However, referring to the phase angle curve, it can be found that the coating characteristics of the test object in FIG. 5 is changed from capacitance (phase angle-90 degrees) to resistance (phase angle-0 degrees) in the middle low frequency region, so the impedance curve is changed from oblique straight line to horizontal line in the low frequency region; and the phase angle of the sample in FIG. 6 represents the characteristics close to pure capacitance, the curve slope in the low frequency region has not changed significantly based-on the impedance curve, but still shows the oblique straight line dominated by the capacitance characteristics.

According to the above results, even for different coatings with the same impedance value, as the characteristics of coatings are different, the measurement accuracy may be reduced. It is speculated that the characteristics of electronic components such as resistor or capacitor will be produced due to different conditions such as the integrity of the coating itself and an interface between the coating and the substrate. When 10 mV AC signal is input into the coating system to be tested, the signal will be affected by these electronic components. If the signal passes through an ideal resistance, the phase difference between the output signal and the input signal will be zero degree. If the signal passes through an ideal capacitor, the phase difference between the output signal and the input signal is −90 degrees. However, in fact, the coating monitoring module is not composed of a single resistor or capacitor component. It may include multiple resistors and capacitors connected in series or in parallel to form a complex circuit, resulting in a phase difference due to delay of the output signal. Therefore, it receives 10 mV AC signal and generates a partial pressure after passing through the coating, the phase shift should be corrected by appropriately signal processing before the coating impedance measured by the coating monitoring module is calculated.

Figure 7:
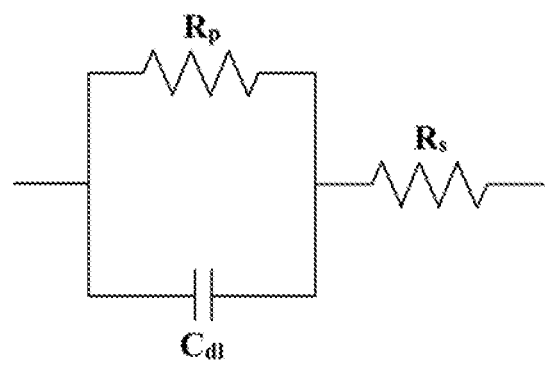
FIG. 7 illustrates a schematic diagram of equivalent circuit model of coating on the object to be measured according to a preferred embodiment of the present invention.

As evaluating the characteristics of coating, RC circuit is often used to establish equivalent circuit model of coating on an object to be measured. As shown in FIG. 7, it shows a schematic diagram of equivalent circuit model of coating on the object to be measured according to a preferred embodiment of the present invention. In FIG. 7, $R_p$ represents charge transfer resistance, also known as polarization impedance, which is a barrier of metal's transition from atomic state to ionic state; $R_s$ represents solution impedance; Cal represents electric double-layer capacitance. According to the basic circuitry theory, the formula for total impedance of this circuit is as follows:

$$Z_{total} = Z_{R_z} + \frac{Z_{R_p} Z_{C_{dl}}}{Z_{R_p} + Z_{C_{dl}}}$$

the formula for impedance of $C_{dl}$ is as follows:

$$Z_{C_{dl}} = \frac{1}{j\omega C_{dl}}$$

The impedance formula of $C_{dl}$ is substituted into the total impedance formula of the circuit, and the total impedance formula of the coating is deduced as follows:

$$Z_{Total} = Z_{R_s} + \frac{Z_{R_p} Z_{C_{dl}}}{Z_{R_p} + Z_{C_{dl}}} = R_s + \frac{\frac{R_p}{j\omega C_{dl}}}{R_p + \frac{1}{j\omega C_{dl}}} =$$

$$R_s + \frac{R_p}{1 + j\omega R_p C_{dl}} = R_s + \frac{R_p(1 - j\omega R_p C_{dl})}{(1 + j\omega R_p C_{dl})(1 - j\omega R_p C_{dl})} =$$

$$R_z + \frac{R_p}{1 + \omega^2 R_p^2 C_{dl}^2} - j\frac{\omega R_p^2 C_{dl}}{1 + \omega^2 R_p^2 C_{dl}^2}$$

From the above formula, it can be seen that the total impedance includes the real part and the imaginary part, which are caused by the resistance and capacitance respectively. The capacitance will cause phase delay of the signal. If the phase delay issue is not taken into account in signal processing and calculating, it may lead to a larger error in the measurement of coating with obvious capacitance characteristics. Therefore, the present invention will correct the error caused by phase offset, and is expected to make the coating monitoring module more accurate in measurement and more suitable for monitoring the healthy status coating of offshore wind power.

Finally, the monitoring system 100 and the coating monitoring module 130 of this embodiment are used to remind maintenance personnel of the structural state of the wind turbine. However, the corrosion damage of the monitoring system 100 and the coating monitoring module 130 themselves is also an important issue. In order to ensure the safety of the monitoring system 100 and the coating monitoring module 130 and maintain the normal operation, an environmental material of salt-mist-resistance and an airtight box are selected as the housing (shell) for protecting the monitoring system and the coating monitoring module in this embodiment.

The specific experimental method is to place the sealed box in the salt-mist environment for about a week, and inspect the corrosion of bare metal sheets (such as steel sheets or iron sheets) in the box to test the protection of the box. Firstly, salt water solution with 5 wt % is used and the temperature of salt-mist environment is controlled at 33-37° C. Considering the characteristics that metal is susceptible to chloride ion corrosion, acrylic housing and plastic waterproof box are selected for salt-mist test. The raw material of acrylic sealing box is 15 millimeter (mm) acrylic plate, about 750 centimeter (cm)³ in size. Referring to the protective shell design of marine electrical appliances, circular rings are added to ensure air tightness. Considering that only four corners are locked by screw, which will cause distortion due to uneven stress, it is added to use multiple M3 screw. The two openings below are needed for the monitoring system and the coating monitoring module, which reserved external connectors for working electrodes and auxiliary electrodes are applied thereto. Material of the used screw is corrosion resistant titanium metal.

The operation method of a coating monitoring system of wind turbines of the present invention will be described in the following. In some embodiments, the operation method of the coating monitoring system of wind turbines may be illustrated by using the above-mentioned coating monitoring system of wind turbines and shown in FIG. 8, which is a flow chart of the operation method of the coating monitoring system of wind turbines in a preferred embodiment of the invention.

Figure 8:
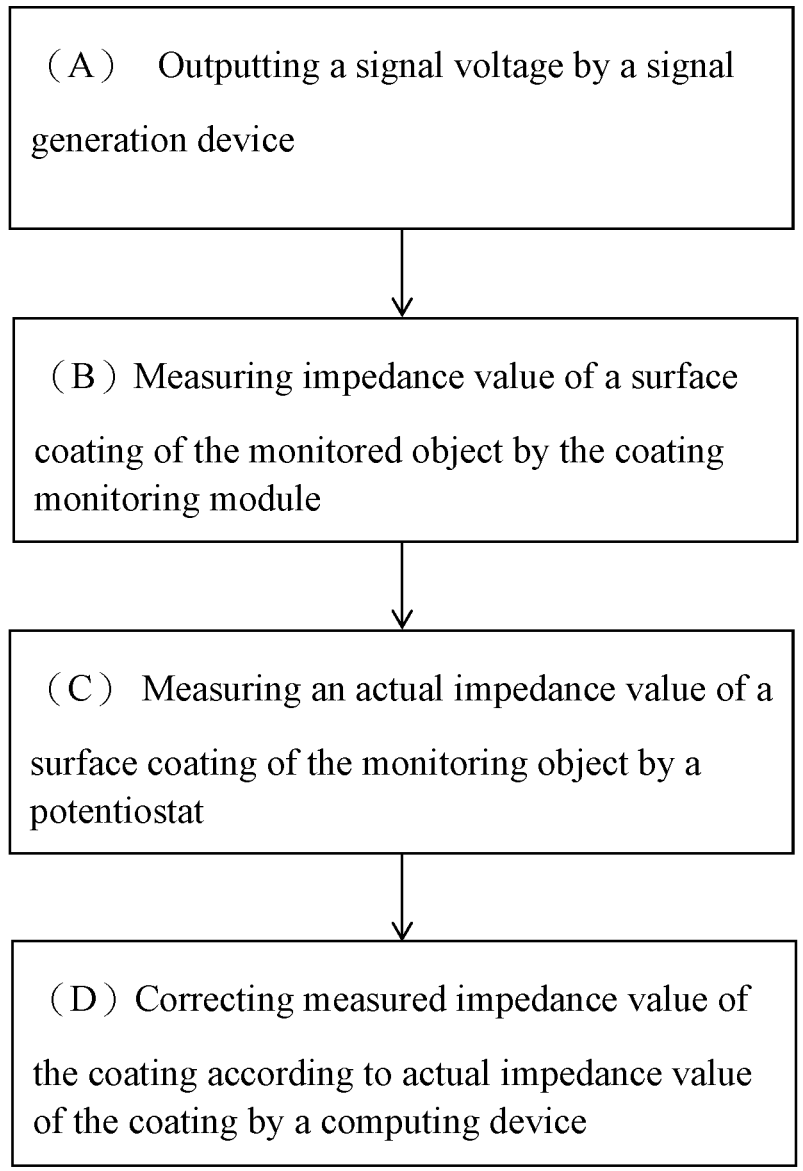
FIG. 8 is a flow chart of the operation method of the coating monitoring system of wind turbines of the preferred embodiment of the present invention.

As shown in FIG. 8, the operation method of the present embodiment is described as follows. Firstly, in step (A), the coating monitoring module 130 is fixed on the offshore wind power generation equipment (or called monitoring object 110), or the monitoring object 110 can be connected with the coating monitoring module 130 after it is removed from the offshore wind power generation equipment. Then, the power supply of the signal generation device 132 of the MEMS 131 in the coating monitoring module 130 is turned on, and a signal voltage is output through the signal generation device 132 to the printed circuit board 133.

Then, in step (B), a surface coating of the monitored object 110 is measured by the coating monitoring module 130, and a measured impedance value of the surface coating of the monitored object 110 is obtained. Specifically, in the coating monitoring module 130, the measurement method of the MEMS 131 and the printed circuit board 133 is connecting the monitoring object 110 in series with a known resistance $Z_{ref}$, and an input terminal of the signal voltage V1 and an output terminal of the signal voltage V2 are set at both terminals of the known resistance $Z_{ref}$, respectively. On the other hand, the input terminal of the signal voltage V1 can be connected with the signal generating device 132, and the signal generating device 132 outputs a signal voltage to the printed circuit board 133. After acquiring the signal voltage V1 of the input terminal and the signal voltage V2 of the output terminal, based-on the resistance value of known resistance $Z_{ref}$, the value of impedance $Z_c$ of a measured coating of the monitoring object can be obtained by the transformation of voltage dividing formula, $$V_2(1\ Hz) = V_1(1\ Hz) \frac{Zc(1\ Hz)}{Zref + Zc(1\ Hz)}.$$

Finally, the impedance value $Z_c$ of the measured coating is converted to a digital signal by an Analog-to-digital converter (ADC) and outputted to the MEMS 131. Among them, the resistance of the known resistance $Z_{ref}$ is $10^8$ ohms, and the signal generating device 132 outputs 10 mV (millivolts) signal voltage.

Specifically, the measurement method of the coating monitoring module 130 is utilizing the monitoring object 110 (a portion of the monitoring object) glued to the bottom of a water pipe container 230 (the area to be measured is about 5-10 cm²), then the corrosion solution of sodium chloride 250 with the concentration between 3.0-4.0 weight percentage (wt %) (preferable 3.5 wt %) is filled into the container 230. A reference electrode 210 (graphite carbon rod) is placed in the solution to complete a closed circuit system of accurate measurement, and the environmental temperature of measuring is controlled at 25° C. The coating of the monitoring object 110 with better corrosion resistance can be selected, such as a single layer of epoxy resin with a thickness of 200 or 250 micrometer (m) or a single layer of polyurethane with a thickness of 30-50 μm, and the alternating current (AC) impedance value is larger than $10^8$ ohms. At the beginning of the measurement, AC potential output by the signal generating device is set by a tiny potential (10 mV) to ensure that the coating does not be damaged in measuring process. The measured data under the tiny potential is compared with data measured by the potentiostat, and discusses the measurement accuracy for AC impedance of the coating of the coating monitoring module 130.

In addition, in the step (C), the potentiostat 150 connected to the coating monitoring module 130 is used to measure a surface coating of the monitoring object 110 to obtain an actual impedance value of the coating of the monitoring object 110. The actual impedance value of the coating of the monitoring object 110 is transmitted to the computing device 170 via the coating monitoring module 130.

Finally, in step (D), a computing device 170 receives the measured impedance value of the coating measured by the MEMS 131 in the coating monitoring module, and the actual impedance value of the coating measured by potentiostat 150. According to the actual impedance value of the coating, the error caused by phase offset is corrected, which is expected to make the coating monitoring module more accurate in measurement and more suitable for monitoring the healthy status coating of offshore wind power.

The coating monitoring system of wind turbines and its operation method of the invention have the advantages including: greatly reducing the size of the system so that the coating monitoring system of wind turbines can be directly installed in various offshore wind power generation equipment, or the coating monitoring module can be assembled in offshore wind power generation equipment, and the measured value can be wirelessly transmitted to the outside device. In addition, the coating monitoring system of wind turbines can reduce the maintenance cost of the monitored objects, and has the functions of instant understanding of structure status of wind turbines and predicting maintenance, and thus reducing the monitoring cost and the risk of replacing monitored objects. Furthermore, the monitoring system and the coating monitoring module have the function of preventing corrosion damage to ensure the safety of the system itself and maintain normal operation.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure. While the preferred embodiment of the invention has been illustrated and described, it will be appreciated that various changes can be made therein without departing from the spirit and scope of the invention.

What is claimed is:

1. A coating monitoring system of a wind turbine, comprising:
   a monitoring object, which has at least one coating on its surface;
   a coating monitoring module connected with said monitoring object, wherein said coating monitoring module includes a micro-electromechanical system (MEMS) including a signal generating device, and a printed circuit board connected to the MEMS system, wherein said coating monitoring module measures an impedance value of said coating;
   a potentiostat coupled to said monitoring object and said coating monitoring module, to measure an actual impedance value of said coating of said monitoring object; and
   a computing device coupled to said coating monitoring module, wherein said computing device corrects said measured impedance value of said coating based on said actual impedance value of said coating;
   wherein said coating monitoring module measures said monitoring object which is connected in series with a known resistance to compute said impedance value of said coating of said monitoring object by a voltage dividing formula.

2. The system of claim 1, wherein a material of said coating of said monitoring object is a single layer of epoxy resin or polyurethane.

3. The system of claim 1, wherein said MEMS has a system circuit.

4. The system of claim 3, wherein said system circuit is used to connect said monitoring object in series with said known resistance.

5. The system of claim 1, wherein an output frequency of said potentiostat is 1 Hz.

6. An operation method of a coating monitoring system of a wind turbine, comprising:
   (A) outputting a signal voltage by a signal generation device;
   (B) measuring an impedance value of a surface coating of a monitoring object by a coating monitoring module, wherein said monitoring object is connected in series with a known resistance to compute an impedance value of said surface coating of said monitoring object by a voltage dividing formula;
   (C) measuring an actual impedance value of said surface coating of said monitoring object by a potentiostat; and
   (D) correcting said measured impedance value of said surface coating according to said actual impedance value of said surface coating by a computing device.

7. The method of claim 6, wherein, in said step (B), a material of said surface coating of said monitoring object is a single layer of epoxy resin or polyurethane.

8. The method of claim 6, wherein, in said step (B), in measuring process of said coating monitoring module, wherein said monitoring object is adhered to a container, then a corrosion solution of sodium chloride is filled into said container, and placing a reference electrode in said solution to complete a closed circuit system to measure an actual impedance value of said surface coating of said monitoring object.

9. The method of claim 6, wherein an output frequency of said potentiostat is 1 Hz.

* * * * *